United States Patent
Eui-Yeol

[11] Patent Number: 6,035,871
[45] Date of Patent: Mar. 14, 2000

[54] APPARATUS FOR PRODUCING SEMICONDUCTORS AND OTHER DEVICES AND CLEANING APPARATUS

[75] Inventor: Oh Eui-Yeol, Gunpo, Rep. of Korea

[73] Assignee: Frontec Incorporated, Sendai, Japan

[21] Appl. No.: 09/040,897

[22] Filed: Mar. 18, 1998

[30] Foreign Application Priority Data

Mar. 18, 1997 [JP] Japan ................................ 9-064018

[51] Int. Cl.⁷ .................................................. B08B 3/02
[52] U.S. Cl. ...................... 134/61; 134/95.3; 134/102.2; 134/902
[58] Field of Search ........................... 134/61, 902, 95.3, 134/102.1, 102.2, 95.2; 204/265

[56] References Cited

U.S. PATENT DOCUMENTS

| | | | |
|---|---|---|---|
| 4,682,615 | 7/1987 | Burkman et al. ..................... | 134/95.3 |
| 4,855,023 | 8/1989 | Clark et al. .......................... | 134/902 |
| 5,068,040 | 11/1991 | Jackson . | |
| 5,177,514 | 1/1993 | Ushijima .............................. | 354/319 |
| 5,224,503 | 7/1993 | Thompson et al. ................... | 134/95.3 |
| 5,253,663 | 10/1993 | Tanaka ................................. | 134/95.2 |
| 5,261,966 | 11/1993 | Mashimo et al. . | |
| 5,409,310 | 4/1995 | Owczarz .............................. | 134/95.3 |
| 5,445,171 | 8/1995 | Ohmori ................................ | 134/61 |
| 5,447,640 | 9/1995 | Omi et al. . | |
| 5,518,542 | 5/1996 | Matsukawa .......................... | 118/52 |
| 5,549,798 | 8/1996 | Kitajima .............................. | 204/222 |
| 5,568,821 | 10/1996 | Ohmori ................................ | 134/61 |
| 5,578,193 | 11/1996 | Aoki .................................... | 205/746 |
| 5,589,052 | 12/1996 | Shimamune et al. . | |
| 5,701,627 | 12/1997 | Matsumura .......................... | 15/88.2 |
| 5,720,869 | 2/1998 | Yamanaka et al. . | |
| 5,806,543 | 9/1998 | Ohmi ................................... | 134/61 |
| 5,815,762 | 9/1998 | Sakai .................................. | 396/611 |
| 5,824,200 | 10/1998 | Kitajima .............................. | 204/265 |
| 5,839,456 | 11/1998 | Han ..................................... | 134/104.1 |

FOREIGN PATENT DOCUMENTS 4-14222  1/1992  Japan .

Primary Examiner—Frankie L. Stinson
Attorney, Agent, or Firm—Brinks Hofer Gilson & Lione

[57] ABSTRACT

Provided is an apparatus for producing semiconductor and other devices, which can improve the quality of deposited films and increase the yield of produced devices in comparison with the conventional apparatus. The apparatus of the invention comprises a plurality of dry treatment chambers (7a, 7b, 7c, 7d, 7e), a transfer room (6) interconnecting the dry treatment chambers (7a, 7b, 7c, 7d, 7e), loading/unloading chambers (8a, 8b, 8c, 8d), and a cleaning apparatus (13). The transfer room (6) and the cleaning apparatus (13) are directly or indirectly connected to each other.

9 Claims, 12 Drawing Sheets

APPARATUS FOR PRODUCING SEMICONDUCTORS AND OTHER DEVICES AND CLEANING APPARATUS

BACKGROUND OF THE INVENTION

1. Field of the Invention

The present invention relates to an apparatus for producing semiconductor and other devices, and more particularly to an apparatus for performing film deposition, etching, etc. on semiconductors and so on (e.g., semiconductors, magnetic substances, conductors, dielectrics and other materials).

2. Description of the Related Art (1) An apparatus for producing semiconductor and other devices, shown in FIG. 10, has been known heretofore.

Semiconductor substrates are cleaned in a cleaning apparatus 1 and then stocked in a carrier 215 (FIG. 11) disposed in a transfer means MTV.

Upon a predetermined number of substrates being stocked in the carrier 215, the carrier 215 including those substrates is carried by the transfer means MTV into any of loading/unloading chambers 8a, 8b, 8c, 8d of the apparatus for producing semiconductor and other devices.

The semiconductor substrates having entered any of the loading/unloading chambers 8a, 8b, 8c, 8d are loaded into standby rooms 9a, 9b by a robot arm (not shown) in a robot room 5, and then transferred through a transfer room 6 to any of dry treatment chambers 7a, 7b, 7c, 7d, 7e where dry treatment (such as film deposition and etching) is performed on the substrates.

After the dry treatment, the semiconductor substrates are transferred to the standby rooms 9a, 9b through the transfer room 6, and then carried back to the loading/unloading chambers 8a, 8b, 8c, 8d by the robot arm in the robot room 5.

In the above apparatus, however, the substrates held in the transfer means MTV are exposed to the atmosphere in a clean room after being cleaned. Particularly, because the carrier 215 usually accommodates about 20 pieces of substrates, a period of about 1 hour is required in some cases from the time at which the first substrate is stocked in the carrier 215 to the time at which the last twentieth substrate is stocked therein. During such a period of time, the substrates held in the transfer means MTV continue exposed to the atmosphere in the clean room.

Exposure to the atmosphere causes impurities to adhere to the substrate surfaces even in the clean room. If film deposition is performed on the substrates with impurities kept adhered to their surfaces, the quality of the deposited films may deteriorate and the yield of the produced devices may reduce.

(2) Meanwhile, there is also known another apparatus for producing semiconductor and other devices, shown in FIG. 12 (see Japanese Unexamined Patent Publication No. 4-14222).

This apparatus comprises a loading/unloading chamber 101, dry treatment chambers 109, 110, a wet treatment chamber 115, and a transfer room 116. The transfer room 116 serves to transfer substrates between the dry treatment chambers 109, 110 and the wet treatment chamber 115.

In this apparatus for producing semiconductor and other devices, because wet treatment can be performed prior to dry treatment, the problem stated in connection with the above related art (1) is solved to some extent. More specifically, a substrate placed in the loading/unloading chamber 101 is transferred from the loading/unloading chamber 101 to the wet treatment chamber 115 through the transfer room 116. In the wet treatment chamber 115, wet treatment is performed on the substrate to remove impurities having adhered to it in the clean room. Thus, some amount of impurities can be removed by performing the dry treatment after the wet treatment. Accordingly, the apparatus of this related art (2) can provide better film quality than obtainable with the above related art (1).

An improvement in film quality resulted with the related art (2) is, however, not so satisfactory as expected. The reason is as follows. In the apparatus of the related art (2), an object to be treated, i.e., a substrate, is loaded from the loading/unloading chamber 101 into the wet treatment chamber 115 after having passed the transfer room 116. Stated otherwise, because the substrate is transferred through the transfer room 116 while impurities are kept adhered to the substrate, the transfer room 116 is inevitably contaminated.

In the apparatus of the related art (2), though not shown, the substrate is cleaned by some means before being carried into the loading/unloading chamber 101.

Further, the above-cited Japanese Unexamined Patent Publication No. 4-14222 does not disclose details of the wet treatment performed in the wet treatment chamber 115, and therefore what kinds of chemicals are used to perform the wet treatment is not clear.

SUMMARY OF THE INVENTION

An object of the present invention is to provide an apparatus for producing semiconductor and other devices, which can improve the quality of deposited films and increase the yield of produced devices in comparison with the conventional apparatus.

The apparatus for producing semiconductor and other devices according to the present invention comprises a plurality of dry treatment chambers, a transfer room interconnecting the dry treatment chambers, a cleaning apparatus provided with a cleaning room in which there are disposed a holder for rotatably holding an object to be treated, an ozonized water supply nozzle for supplying ozonized water to the treated object, and a hydrogenated water supply nozzle for supplying hydrogenated water to the treated object, and a loading/unloading chamber through which the treated object is loaded into the cleaning apparatus and the treated object after being subjected to dry treatment is unloaded from the cleaning apparatus, the transfer room and the cleaning apparatus being directly or indirectly connected to each other.

With the construction set forth above, the apparatus for producing semiconductor and other devices is provided which can improve the quality of deposited films and increase the yield of produced devices in comparison with the conventional apparatus.

BRIEF DESCRIPTION OF THE DRAWINGS

FIG. 13 is a graph showing results measured in an experimental example in which;

DESCRIPTION OF THE PREFERRED EMBODIMENTS (Embodiment 1)

Figure 1:
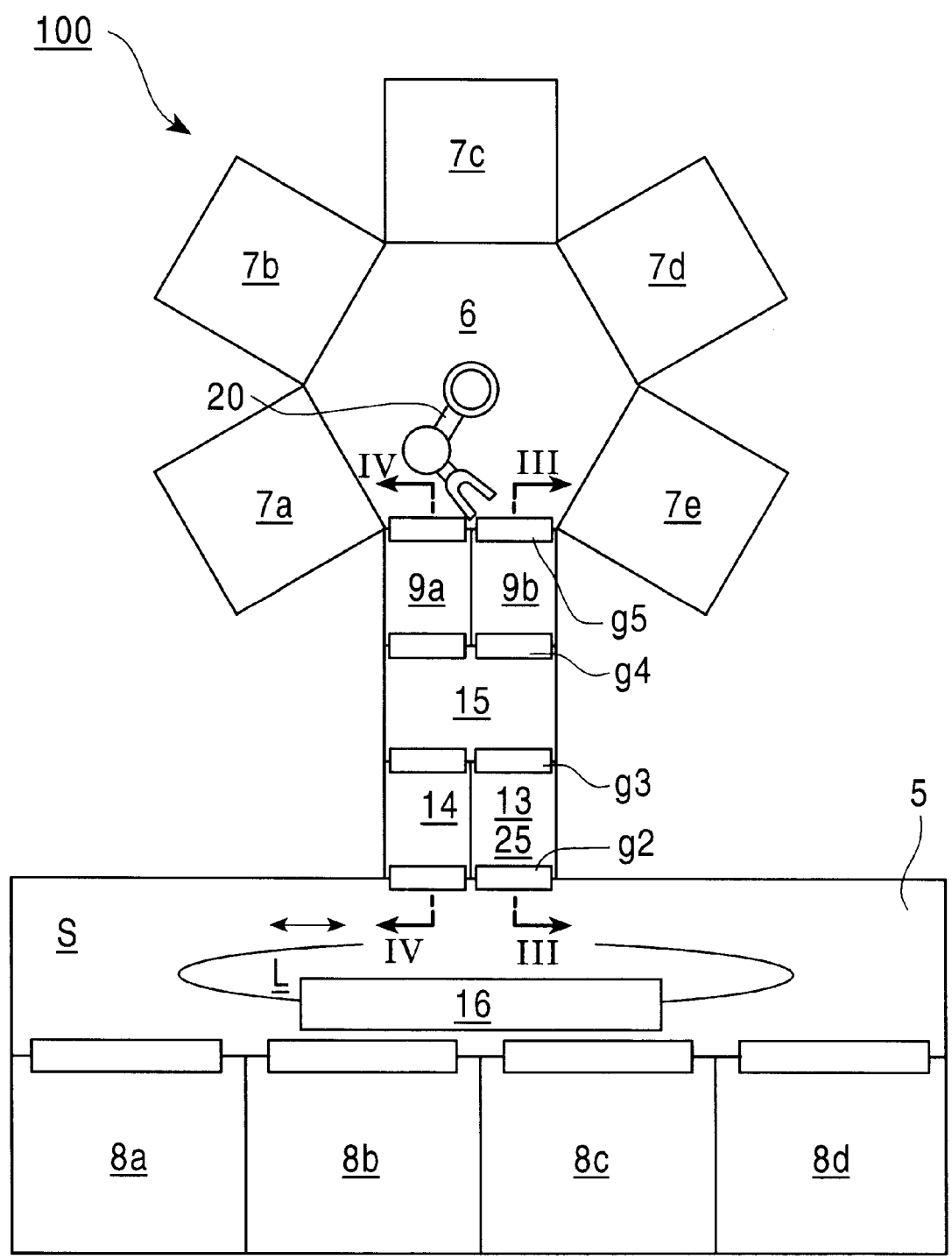
FIG. 1 is a conceptual plan view of an apparatus for producing semiconductor and other devices according to Embodiment 1.

FIG. 1 shows one embodiment of an apparatus for producing semiconductor and other devices.

An apparatus 100 for producing semiconductor and other devices according to Embodiment 1 comprises a plurality of dry treatment chambers 7a, 7b, 7c, 7d, 7e, a transfer room 6 interconnecting the dry treatment chambers 7a, 7b, 7c, 7d, 7e, loading/unloading chambers 8a, 8b, 8c, 8d, and a cleaning apparatus 13. The cleaning apparatus 13 is interposed between the loading/unloading chambers 8a, 8b, 8c, 8d and the transfer room 6.

Figure 2:
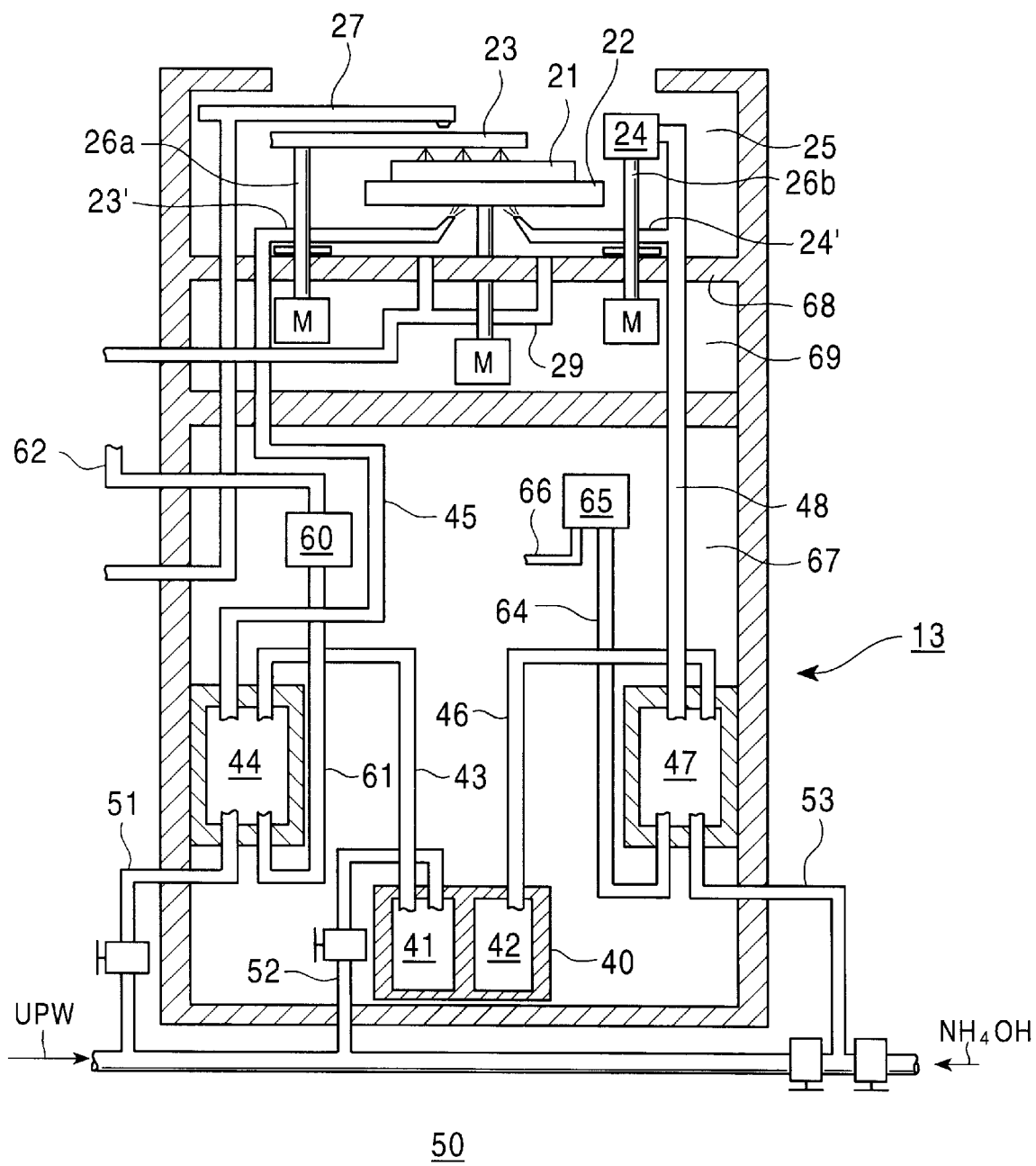
FIG. 2 is a front sectional view of a cleaning apparatus in Embodiment 1.

Details of the cleaning apparatus 13 are as shown in FIG. 2. More specifically, the cleaning apparatus 13 has a cleaning room 25 in which there are disposed a holder 22 for rotatably holding an object 21 to be treated, such as a semiconductor substrate or a liquid crystal substrate, an ozonized water supply nozzle 23 for supplying ozonized water to the treated object 21, and a hydrogenated water supply nozzle 24 for supplying hydrogenated water to the treated object 21.

Thus, the apparatus 100 for producing semiconductor and other devices according to Embodiment 1 is constructed such that the cleaning apparatus 13 is interposed between the loading/unloading chambers 8a, 8b, 8c, 8d and the transfer room 6. Accordingly, even if the treated object 21 is contaminated by impurities adhering to it before being carried into any of the loading/unloading chambers 8a, 8b, 8c, 8d, the impurities can be removed by cleaning the treated object 21 in the cleaning apparatus 13 prior to the treated object 21 entering the transfer room 6. It is hence possible to prevent impurities from being brought into the transfer room 6 and to ensure very excellent quality of films which are deposited in the dry treatment chambers.

Further, the inventor has found that impurities adhering to the treated object 21 are in the form of particles and organic substances, and that these particles and organic substances can be removed by performing spin cleaning (rotation cleaning) while both ozonized water and hydrogenated water are used as chemical fluids. In this embodiment, since the cleaning room 25 includes therein the holder 22 for rotatably holding the treated object 21, the ozonized water supply nozzle 23 for supplying ozonized water to the treated object 21, and the hydrogenated water supply nozzle 24 for supplying hydrogenated water to the treated object 21, particles and organic substances adhering to the treated object 21 can be removed in the cleaning room 25, enabling films to be deposited on the treated object 21 with good quality.

The apparatus according to this embodiment will be described in more detail below.

Figure 11:
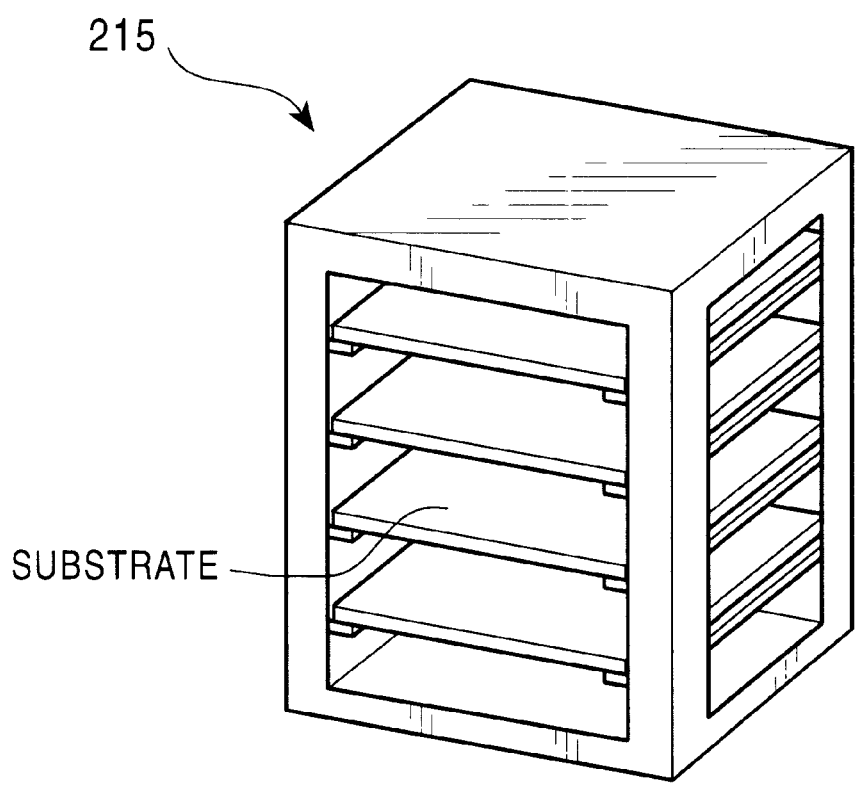
FIG. 11 is a perspective view of a carrier.
Figure 12:
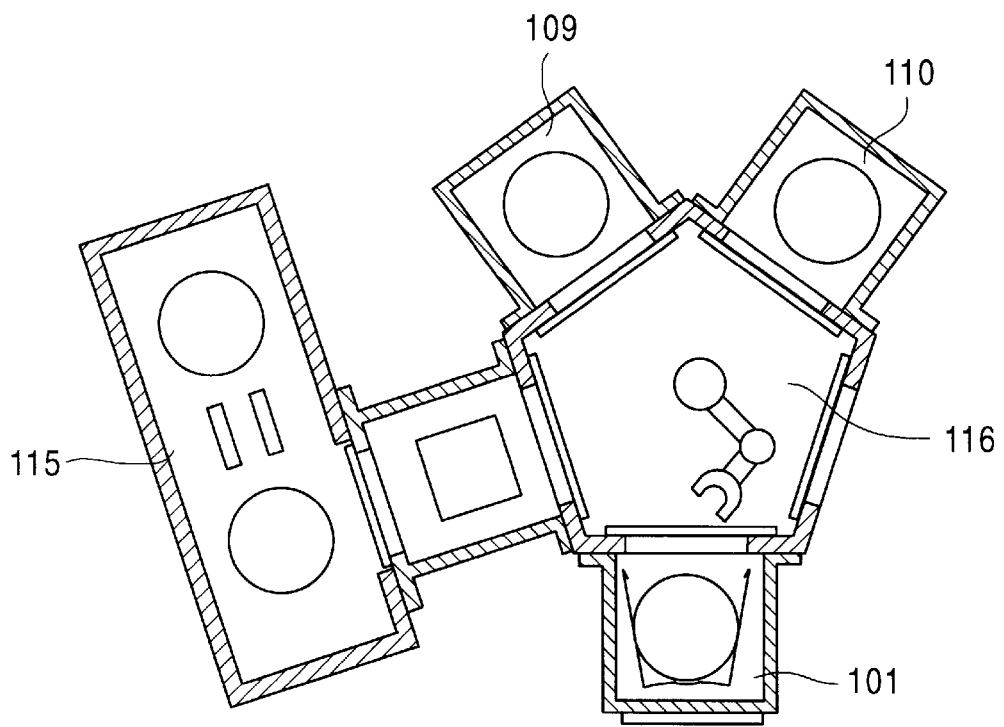
FIG. 12 is a plan view of another conventional apparatus for producing semiconductor and other devices.

In this embodiment wherein the cleaning apparatus 13 is interposed between the loading/unloading chambers 8a, 8b, 8c, 8d and the transfer room 6 as shown in FIG. 1, a plurality of objects to be treated (i.e., substrates) stocked in the carrier 215, shown in FIG. 11, are placed in each of the loading/unloading chambers 8a, 8b, 8c, 8d. The loading/unloading chambers 8a, 8b, 8c, 8d may be exposed to the atmosphere in the clean room, but are preferably cut off from the atmosphere. In the latter case of cutting off the loading/unloading chambers 8a, 8b, 8c, 8d from the atmosphere, those chambers are evacuated by respective vacuum pumps.

Figure 3:
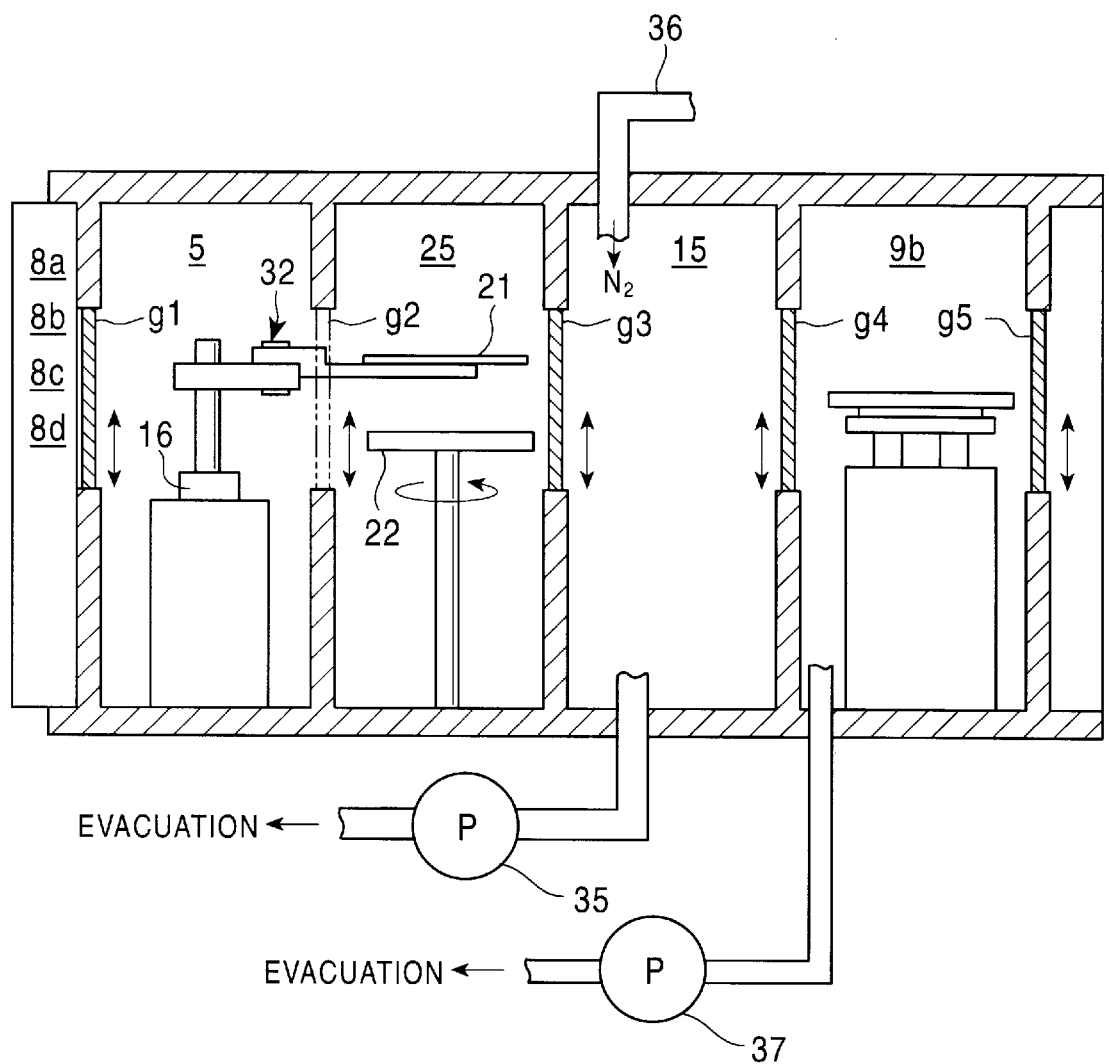
FIG. 3 is a sectional view taken along line III—III in FIG. 1.

On the other hand, a robot room 5 is disposed between the loading/unloading chambers 8a, 8b, 8c, 8d and the cleaning apparatus 13, as shown in FIG. 1 and 3, for carrying the treated object from the loading/unloading chambers 8a, 8b, 8c, 8d into the cleaning apparatus 13. A robot 16 is provided in the robot chamber 5 in such a manner as able to move to the left and right on the drawing sheet of FIG. 1, i.e., in the direction vertical to the drawing sheet of FIG. 3. The robot 16 has an arm 32 capable of not only rotating, but also extending and contracting. With such a mechanism, the robot 16 moves to a position in front of any of the loading/unloading chambers 8a, 8b, 8c, 8d, takes one piece of treated object 21 out of the carrier 215 in that chamber, and gives it to the holder 22 in the cleaning room 25 as shown in FIG. 3.

Also, as shown in FIGS. 1 and 3, the cleaning apparatus 13 and the transfer room 6 are connected to each other through a robot room 15 and standby rooms 9a, 9b.

In the robot room 15, though not shown in FIGS. 1 and 3, there is a similar robot (not shown) to the robot 16 provided in the robot room 5. The robot in the robot room 15 serves to transfer the treated object between the cleaning apparatus 13 and the standby room 9b and between a passage room 14 and the standby room 9a.

As shown in FIG. 3, the robot chamber 15 is evacuated by a vacuum pump 35 to create a vacuum therein. Also, an $N_2$ purge nozzle 36 is provided so as to extend to the robot chamber 15. When cleaning of the treated object 21 is finished in the cleaning apparatus 13, gate valves g3, g4 are opened and the treated object 21 is carried into the standby chamber 9b by the robot (not shown) in the robot chamber 15. At this time, $N_2$ gas is introduced to the robot chamber 15 through the $N_2$ purge nozzle 36 so that the pressure in the robot room 15 is higher than the pressure in the cleaning room 25. By thus keeping the pressure in the robot room 15 higher than the pressure in the cleaning room 25, a cleaning liquid mist produced in the cleaning room is prevented from entering the robot room 15.

The treated object 21 carried into the standby chamber 9b waits there for that treatment of any of other treated objects is ended. The standby chamber 9b is evacuated by a vacuum pump 37 to create a vacuum therein. After waiting in the standby room 9b, the treated object 21 is transferred by an arm 20 provided in the transfer room 6 to predetermined one of the dry treatment chambers in which the treated object 21 is subjected to dry treatment.

Figure 4:
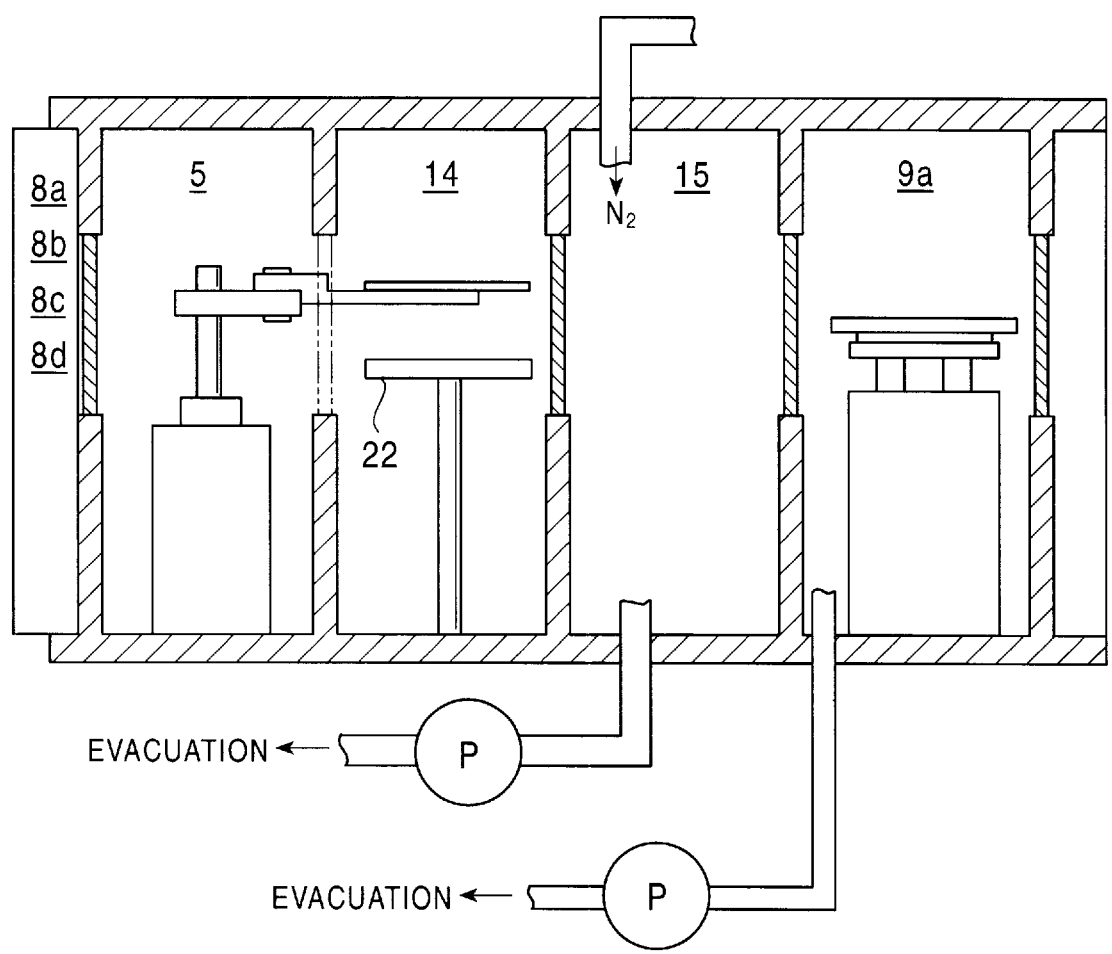
FIG. 4 is a sectional view taken along line IV—IV in FIG. 1.

After the dry treatment, the treated object 21 is carried through the respective rooms shown in FIG. 4 from the right side to the left side. Specifically, the treated object 21 is carried from the transfer room 6 to the robot room 5 through the standby room 9a, the robot room 15 and the passage room 14. The treated object 21 is then carried from the robot room 5 to any of the loading/unloading chambers 8a, 8b, 8c, 8d.

Details of the cleaning apparatus will be explained below with reference to FIG. 2.

In the cleaning room 25 of the cleaning apparatus 13, as mentioned above, there are disposed the holder 22 for rotatably holding the treated object 21, the ozonized water supply nozzle 23 for supplying ozonized water to the treated object 21, and the hydrogenated water supply nozzle 24 for supplying hydrogenated water to the treated object 21. The ozonized water supply nozzle 23 and the hydrogenated water supply nozzle 24 in this embodiment are of the types supplying ozonized water and hydrogenated water in the form of showers, respectively.

Figure 6:
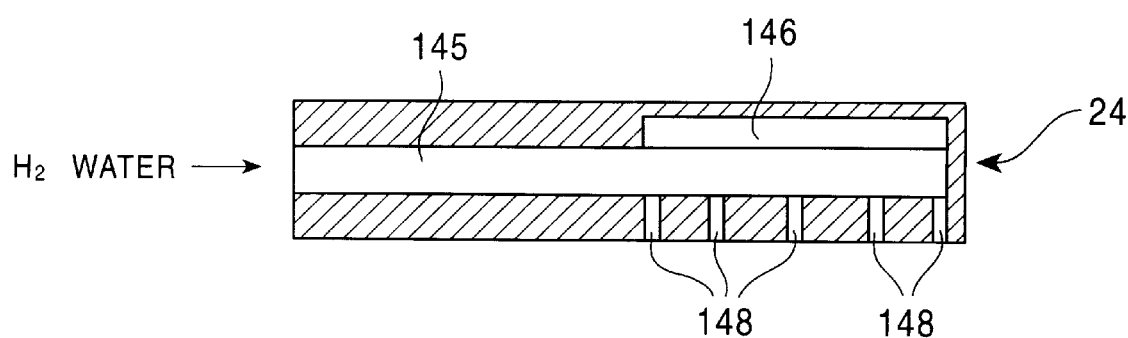
FIG. 6 is a sectional view of a hydrogenated water supply nozzle.

The hydrogenated water supply nozzle 24 is detailed in FIG. 6. In an example shown in FIG. 6, the hydrogenated water supply nozzle 24 has a hydrogenated water path 145 formed therein, and a plurality of ejection holes 148 which are communicated with the hydrogenated water path 145 for allowing the hydrogenated water to eject therethrough in the form of a shower. Also, a ultrasonic vibrator 146 for applying ultrasonic waves to the hydrogenated water is built in the hydrogenated water supply nozzle 24. The ultrasonic frequency generated by the ultrasonic vibrator 146 is preferably not less than 750 kHz.

Figure 5:
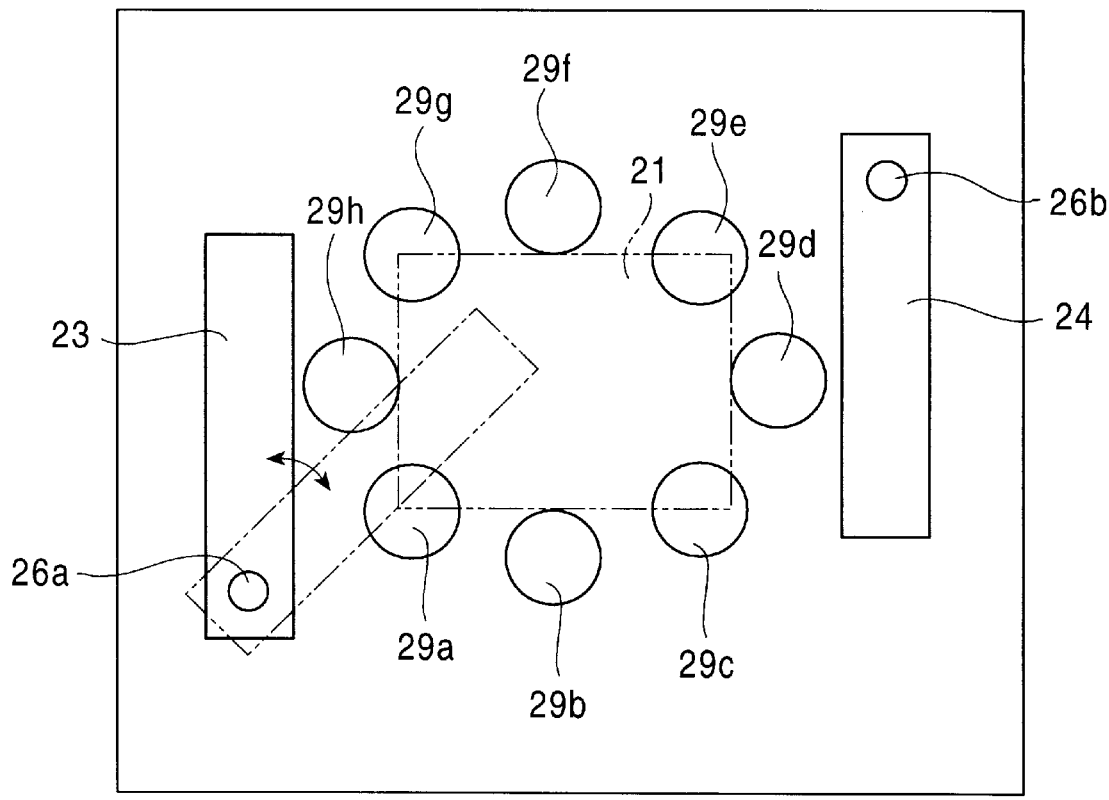
FIG. 5 is a plan view of the cleaning apparatus in Embodiment 1.

FIG. 5 shows the cleaning room 25 as viewed from above.

The ozonized water supply nozzle 23 and the hydrogenated water supply nozzle 24 are supported respectively to shafts 26a, 26b at positions near proximal ends of the nozzles. A motor is operably connected to each of the shafts 26a, 26b. The ozonized water supply nozzle 23 and the hydrogenated water supply nozzle 24 are therefore rotatable about the shafts 26a, 26b, respectively.

In view of the case where the rear surface of the treated substrate 21 is required to be cleaned, an ozonized water supply nozzle 23' and a hydrogenated water supply nozzle 24' for cleaning the rear surface of the treated substrate 21 are also provided in this embodiment.

Denoted by 27 (FIG. 2) is a dry gas supply nozzle for supplying dry gas to dry the treated substrate 21 after the cleaning.

In a bottom wall of the cleaning room 25, there are formed exhaust/drain ports 29 (FIG. 2), 29a, 29b, 29c, 29d, 29e, 29f, 29g, 29h (FIG. 5) for exhausting the dry gas and draining the chemical fluids having been used in the cleaning. It is preferable that those exhaust/drain ports are arranged symmetrically about the center of rotation of the treated substrate 21.

A cleaning water producing apparatus, i.e., an apparatus for producing ozonized water and hydrogenated water, will now be explained with reference to FIG. 2.

In this embodiment, ozonized water and hydrogenated water are produced as follows.

The cleaning water producing apparatus comprises an electrolytic cell 40 made up of an anode chamber 41 for generating ozone gas and a cathode chamber 42 for generating hydrogen gas, an ozone gas discharge pipe 43 for discharging the ozone gas generated in the anode chamber 41 out of the anode chamber 41, an ozone gas dissolving tower 44 connected to the ozone gas discharge pipe 43 for dissolving the ozone gas in pure water to produce ozonized water, a hydrogen gas discharge pipe 46 for discharging the hydrogen gas generated in the cathode chamber 42 out of the cathode chamber 42, and a hydrogen gas dissolving tower 47 connected to the hydrogen gas discharge pipe 46 for dissolving the hydrogen gas in pure water to produce hydrogenated water.

Denoted by 50 is a ultrapure water line which is branched into three branch lines 51, 52, 53. The branch line 51 is a line for supplying ultrapure water to the ozone gas dissolving tower 44. The branch line 52 is a line for supplying ultrapure water to the electrolytic cell 40. Furthermore, the branch line 53 is a line for supplying ultrapure water to the hydrogen gas dissolving tower 47.

The ultrapure water supplied to the electrolytic cell 40 through the branch line 52 is subjected to electrolysis to serve as a source for generating ozone gas and hydrogen gas. The ultrapure water supplied to the ozone gas dissolving tower 44 through the branch line 51 dissolves therein the ozone gas, that is produced by the electrolytic cell 40, in the ozone gas dissolving tower 44 for producing ozonized water. The ultrapure water supplied to the hydrogen gas dissolving tower 47 through the branch line 53 dissolves therein the hydrogen gas, that is produced by the electrolytic cell 40, in the hydrogen gas dissolving tower 47 for producing hydrogenated water.

Excessive ozone gas that has not been dissolved in the ultrapure water in the ozone gas dissolving tower 44 is delivered to an ozone gas decomposer 60 through a waste ozone gas line 61. Activated charcoal for decomposing ozone gas is filled in the ozone gas decomposer 60 to decompose the ozone gas supplied to it. Decomposed gases are exhausted to the outside through an exhaust line 62.

Also, excessive hydrogen gas that has not been dissolved in the ultrapure water in the hydrogen gas dissolving tower 47 is delivered to a hydrogen decomposer 65 through a waste hydrogen gas line 64. A catalyst such as Pd, for example, is filled in the hydrogen decomposer 65 to react with oxygen in air to produce water. The produced water is drained to the outside through a drain line 66.

In this embodiment, a pH-adjusting chemical fluid can be added to the hydrogenated water in the hydrogen gas dissolving tower 47. By adding the pH-adjusting chemical fluid to the hydrogenated water, the pH of the hydrogenated water can be set to a proper value (e.g., not less than pH 7) so that a cleaning fluid with high efficiency of removing particles can be supplied to the treated substrate 21. The pH-adjusting chemical fluid to be added is preferably $NH_4OH$. Although, for example, NaOH, KOH, $NH_4OH$, etc. can be used as the pH-adjusting chemical fluid, $NH_4OH$ is particularly advantageous because it exhibits higher efficiency of removing particles than the other chemical fluids, and accompanies no fear of leaving any alkaline components.

In addition, the cleaning water producing apparatus further includes an ozonized water pipe 45 for introducing the ozonized water from the ozone gas dissolving tower 44 to the cleaning room 25, and a hydrogenated water pipe 48 for introducing the hydrogenated water from the hydrogen gas dissolving tower 47 to the cleaning room 25.

Thus, since the ozonized water and the hydrogenated water can be produced by using one cell, i.e., the electrolytic cell 40, the cleaning water producing apparatus is very compact.

As shown in FIG. 2, therefore, the cleaning water producing apparatus can be installed in a space 67 under the cleaning room 25 of the cleaning apparatus 13 as an integral structure therewith.

The half-life period of ozone in the ozonized water is short, it is preferable that the ozone gas dissolving tower 44 is provided in a position as close as possible to the point where ozone is used, i.e., the cleaning room 25. In the illustrated apparatus, the ozone gas dissolving tower 44 is provided in the space 67 positioned very close to the cleaning room 25, i.e., located right under the cleaning room 25.

In this embodiment, different cleaning fluids for organic substances and particles are produced by the same apparatus, and therefore a cleaning water supply system can be constructed very compact. As a result of the compact cleaning water supply system, this embodiment makes it possible to arrange the system near the cleaning room, to efficiently utilize ozone, in particular, and to increase the cleaning effect.

Furthermore, since ozone gas and hydrogen gas are dissolved in pure water in the respective dissolving towers, clean ozone and hydrogenated water free from any contamination caused by electrodes can be supplied as cleaning fluids to the cleaning room 25.

Additionally, in FIG. 2, denoted by 69 is a motor room for housing motors therein. The motor room 69 is separated from the cleaning room 25 with a bottom plate 68 between both the rooms. A motor has many sliding parts and generates a large number of particles. With the above in mind, the motor room 69 and the cleaning room 25 are separated from each other to prevent particles from entering the cleaning room where the treated object is under cleaning.
(Embodiment 2)

Figure 7:
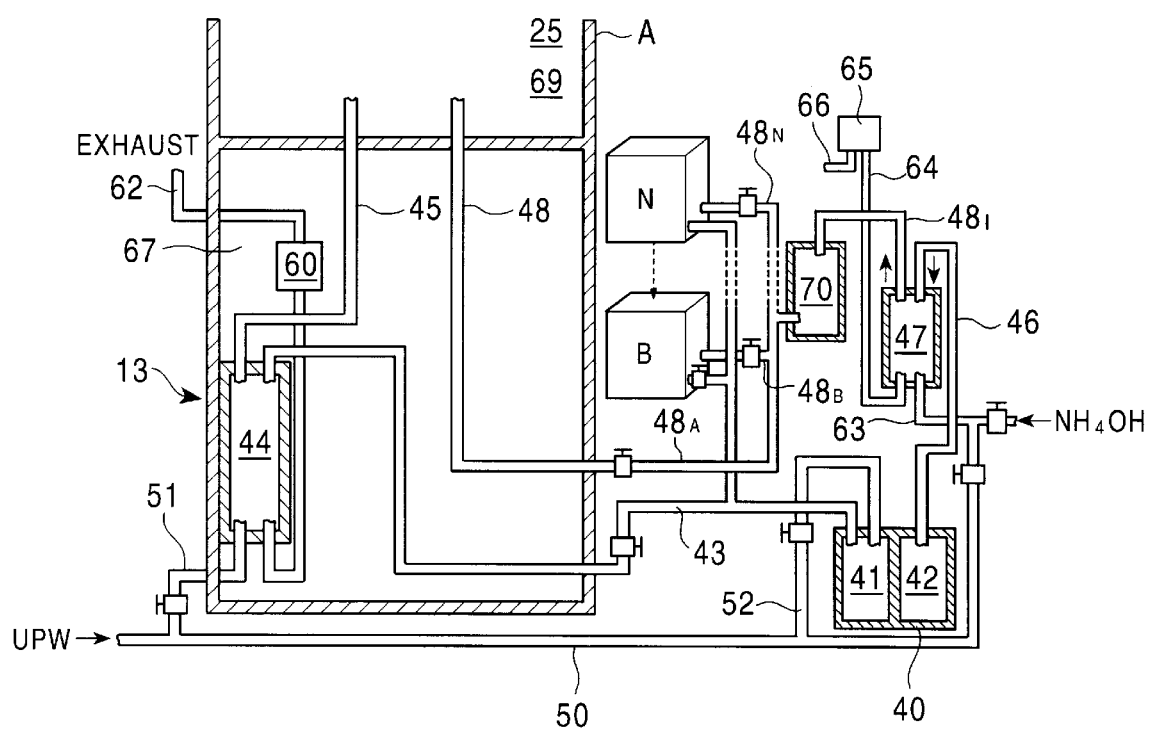
FIG. 7 is a front sectional view of a cleaning apparatus in Embodiment 2.

Embodiment 2 will be described below with reference to FIG. 7.

In this embodiment, a cleaning water producing apparatus comprises an electrolytic cell 40 made up of an anode chamber 41 for generating ozone gas and a cathode chamber 42 for generating hydrogen gas, an ozone gas discharge pipe 43 for discharging the ozone gas generated in the anode chamber 41 out of the anode chamber 41, an ozone gas dissolving tower 44 connected to the ozone gas discharge pipe 43 for dissolving the ozone gas in pure water to produce ozonized water, a hydrogen gas discharge pipe 46 for discharging the hydrogen gas generated in the cathode chamber 42 out of the cathode chamber 42, a hydrogen gas dissolving tower 47 connected to the hydrogen gas discharge pipe 46 for dissolving the hydrogen gas in pure water to produce hydrogenated water, an ozonized water pipe 45 for introducing the ozonized water from the ozone gas dissolving tower 44 to the cleaning room 25, and hydrogenated water pipes $48_1$, $48_A$, $48_B$, . . . ,$48_N$ for introducing the hydrogenated water from the hydrogen gas dissolving tower 47 to the cleaning room 25.

Also, the ozone gas dissolving tower 44 is provided in a space 67 under the cleaning room 25 of the cleaning apparatus 13.

The above-mentioned basic construction is the same as in Embodiment 1.

In this embodiment, primary parts of the cleaning water producing apparatus, i.e., the electrolytic cell 40 and the hydrogen gas dissolving tower 47, are disposed outside the cleaning apparatus 13.

With primary parts of the cleaning water producing apparatus, especially the electrolytic cell 40, disposed outside the cleaning apparatus 13, the hydrogenated water can be supplied to a plurality of cleaning apparatus A, B, . . . , N. In the cleaning water producing apparatus shown in FIG. 7, the hydrogenated water pipes $48_A$, $48_B$, . . . ,$48_N$ are branched so as to be able to supply the hydrogenated water to the plurality of cleaning apparatus A, B, . . . , N. Note that a hydrogenated water storage tank 70 capable of storing hydrogenated water therein is provided downstream of the hydrogen gas dissolving tower 47.

The remaining arrangement including, e.g., the point that $NH_4OH$ is added as a pH-adjusting chemical fluid to the hydrogenated water, is the same as in Embodiment 1.

This embodiment is particularly effective in the case where a large amount of ozonized water or hydrogenated water is employed, or where the apparatus for producing semiconductor and other devices includes a plurality of cleaning apparatus, or where the apparatus for producing semiconductor and other devices, which includes a cleaning apparatus, is installed in each of a plurality of cleaning rooms.
(Embodiment 3)

Figure 8:
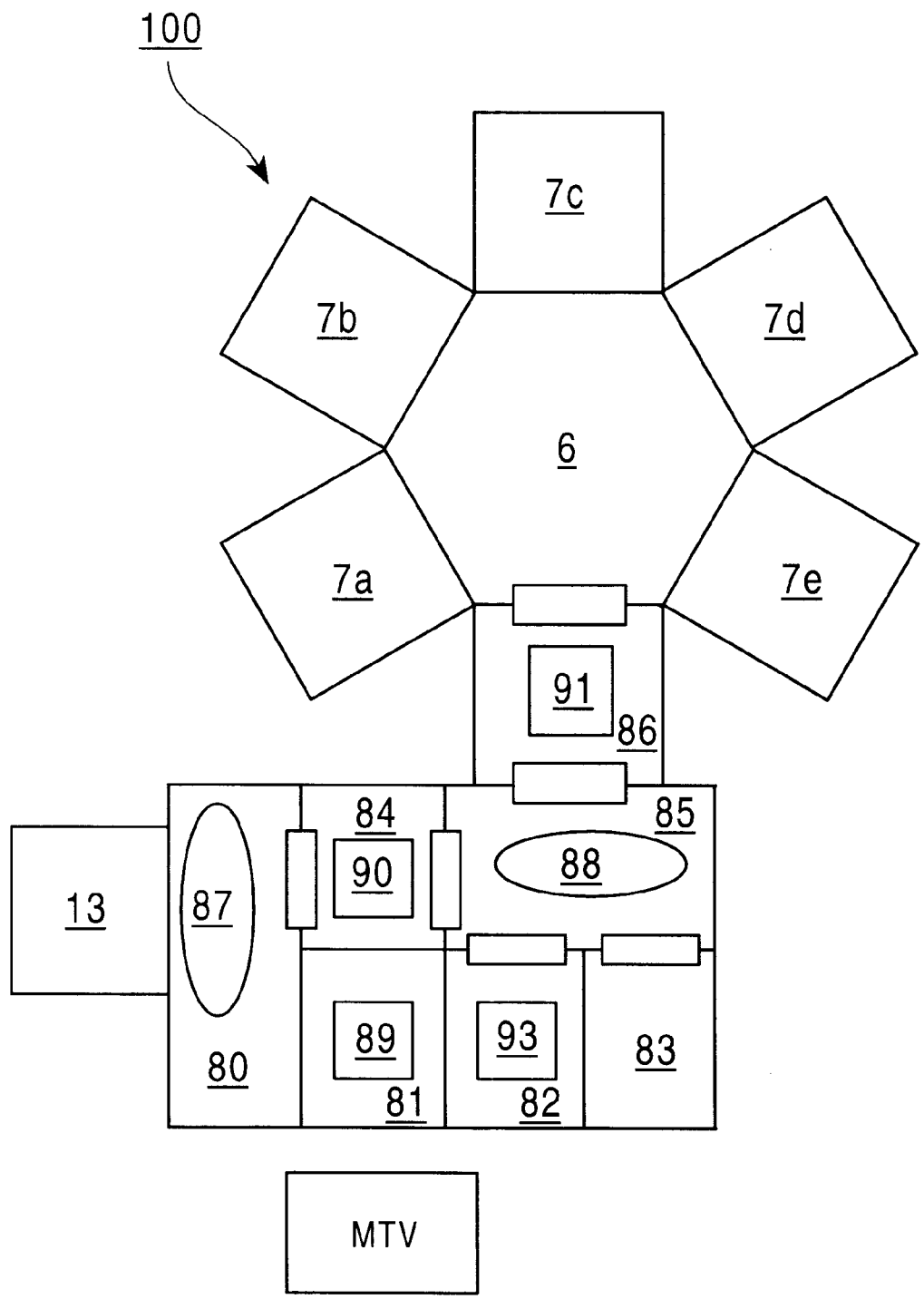
FIG. 8 is a conceptual plan view of an apparatus for producing semiconductor and other devices according to Embodiment 3.
Figure 9:
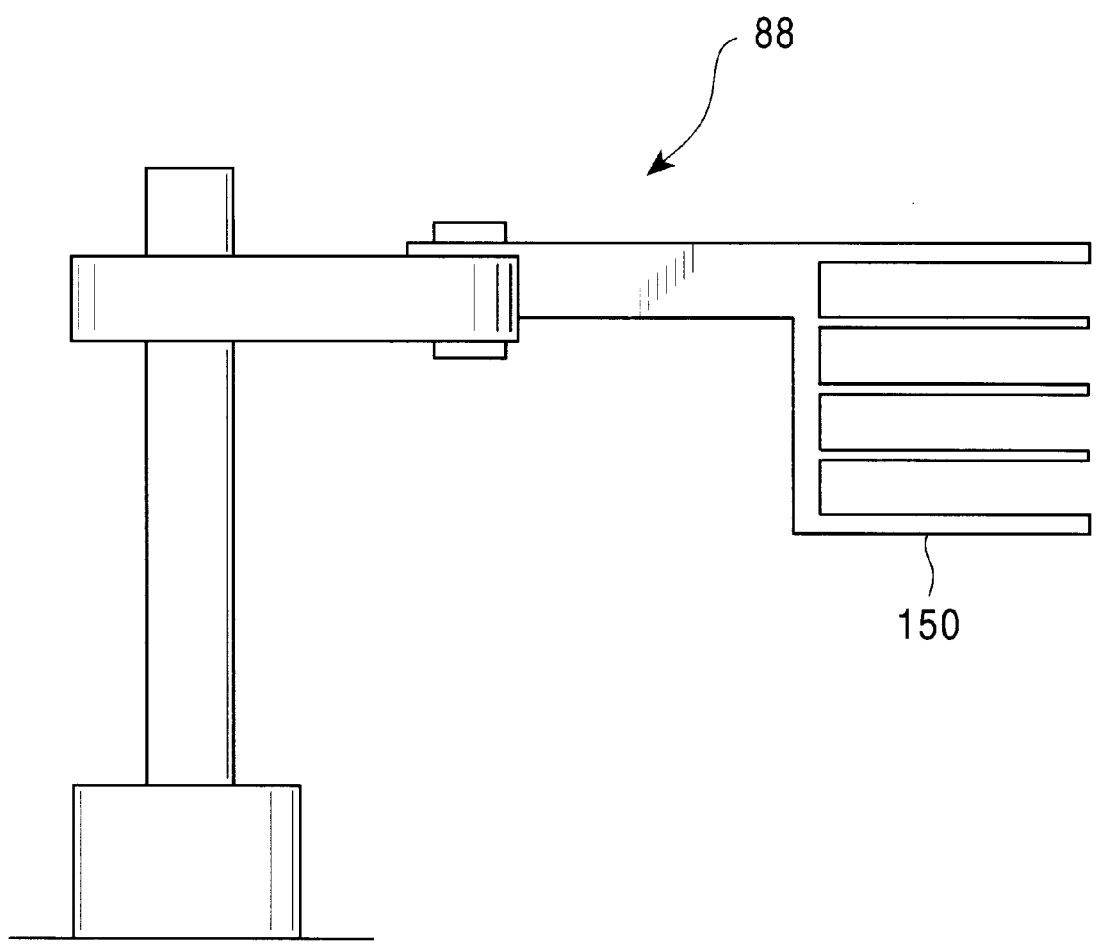
FIG. 9 is a side view of a robot in Embodiment 3.
Figure 10:
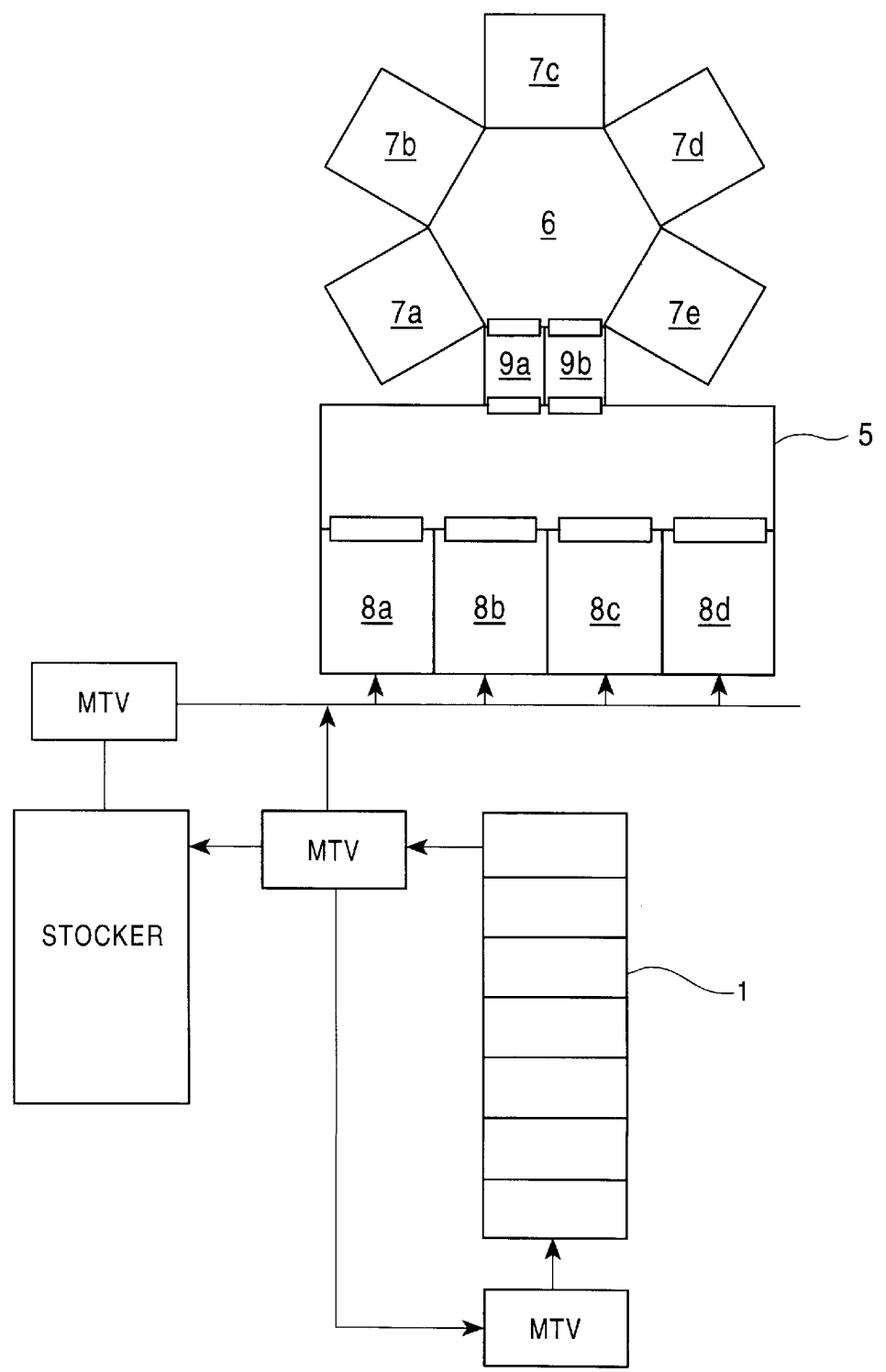
FIG. 10 is a conceptual plan view of a conventional apparatus for producing semiconductor and other devices.

Embodiment 3 will be described below with reference to FIG. 8.

An apparatus 100 for producing semiconductor and other devices according to this embodiment comprises a plurality of dry treatment chambers 7a, 7b, 7c, 7d, 7e, a transfer room 6 interconnecting the dry treatment chambers 7a, 7b, 7c, 7d, 7e, loading/unloading chambers 81, 82, 83, and a cleaning apparatus 13 provided with a cleaning room in which there are disposed a holder for rotatably holding an object to be treated, an ozonized water supply nozzle for supplying ozonized water to the treated object, and a hydrogenated water supply nozzle for supplying hydrogenated water to the treated object. The transfer room 6 and the cleaning apparatus 13 are connected to each other as explained later.

The apparatus 100 for producing semiconductor and other devices will now be described in detail.

This embodiment represents the case where three loading/unloading chambers denoted by 81, 82, 83 are provided. The loading/unloading chamber 81 is a chamber mainly used for loading and standby purposes. The loading/unloading chambers 82, 83 are chambers mainly used for unloading purpose.

A robot room 80 provided therein with a carrying robot 87 is disposed between the loading/unloading chamber 81 and the cleaning apparatus 13.

Further, the cleaning apparatus 13 is connected to the transfer room 6 through the robot room 80, a standby room 84, a robot room 85, and a standby room 86.

In the apparatus 100 for producing semiconductor and other devices, an object to be treated is treated as follows. Specifically, a plurality of treated objects are stocked in a carrier outside the apparatus 100 for producing semiconductor and other devices. The carrier including the treated objects stocked therein is carried by a transfer mans MTV into the loading/unloading chamber 81 of the apparatus 100 for producing semiconductor and other devices. Denoted by 89 is a carrier which has been carried into the loading/unloading chamber 81.

One piece of treated objects is picked up by the robot 87 in the robot room 80 out of the carrier in the loading/unloading chamber 81, and then transferred to the cleaning apparatus 13. After cleaning in the cleaning apparatus 13, the treated object is put in an empty cassette 90 kept on standby in the standby room 84. Cleaning of the treated object is continued successively until a predetermined number of treated objects are put in the cassette 90.

In the robot chamber 85, there is provided a robot 88 provided at its distal end with a holding portion 150 which can hold a plurality of treated objects therein. The robot 88 takes the plurality of treated objects out of asthe cassette 90 at a time and delivers them to another cassette 91 placed in the standby room 86.

Several or one of the treated objects is pulled out of the cassette 91 in the standby room 86 and then loaded into any of the dry treatment chambers.

After being subjected to the dry treatment, the several or one treated object is returned to the cassette 91. Upon a predetermined number of treated objects being put in the cassette 91, the treated objects are delivered by the robot 88 at a time from the cassette 91 to an empty carrier 93 in the loading/unloading chamber 82.

(Experimental Example)

The following test was made by using the apparatus for producing semiconductor and other devices, shown in FIG. 1.

Substrates for liquid crystal display devices, which include silicon films formed on their surfaces, were prepared as a sample a, a sample b, a sample c, and a sample d.

On the other hand, ozonized water and hydrogenated water were produced on the following conditions by using the cleaning apparatus shown in FIG. 2.

(Conditions for Producing Hydrogenated Water and Ozonized Water)

voltage$\approx$3[V]

current$\approx$35[A]

a mount of ozone gas generated$\approx$1.3[g/hr]

amount of hydrogen gas generated$\approx$1.3[g/hr]

ozonized water
- (a) 6[ppm], 2 [1/min]
- (b) ORP$\approx$1270[mV] vs [NHE]
- (c) pH$\approx$6.3 hydrogenated water
- (a) 1.2[ppm], 2 [1/min]
- (b) ORP$\approx$-630[mV] vs [NHE]
- (c) pH$\approx$10

* ORP: oxidizing/reducing potential

The substrate for a liquid crystal display device, prepared as the sample a, was carried into the cleaning apparatus 13 via the loading/unloading chamber 8a and the robot room 5. In the cleaning apparatus 13, the substrate for a liquid crystal display device was cleaned with the ozonized water and the hydrogenated water.

The cleaning was conducted by first spraying the ozonized water for 10 seconds and then spraying the hydrogenated water for 30 seconds.

After the end of the cleaning, the substrate for a liquid crystal display device was taken out to the outside via the robot room 5 and the loading/unloading chamber 8d, followed by measuring cleanness of the substrate surface. The cleanness was evaluated from the contact angle of the substrate surface and the number of particles adhering to it. Here, a greater contact angle means that organic substances are present in a larger number.

Figure 13A:
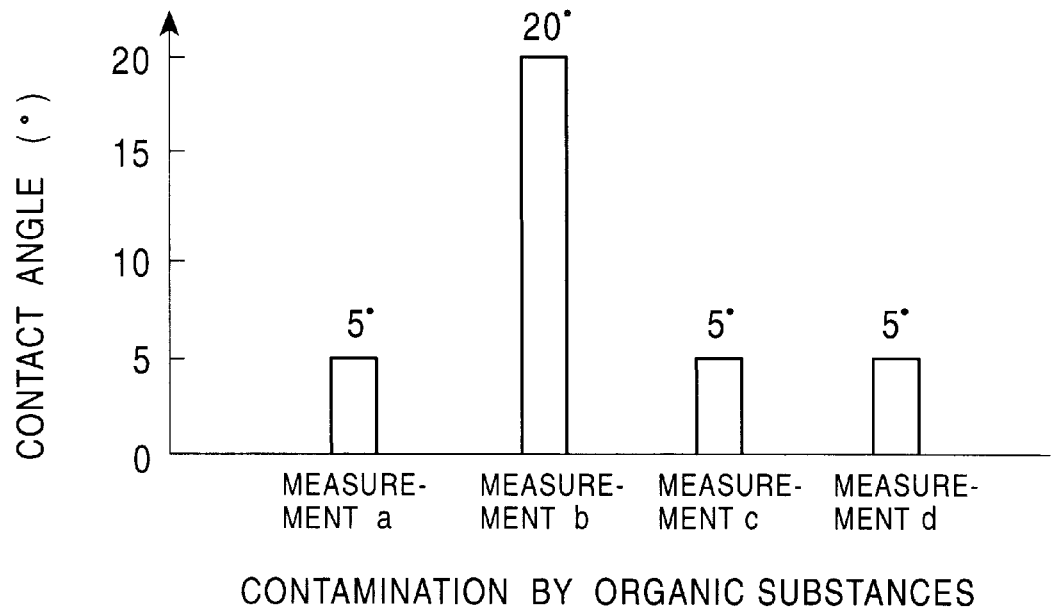
FIG. 13A represents contamination caused by organic substances.
Figure 13B:
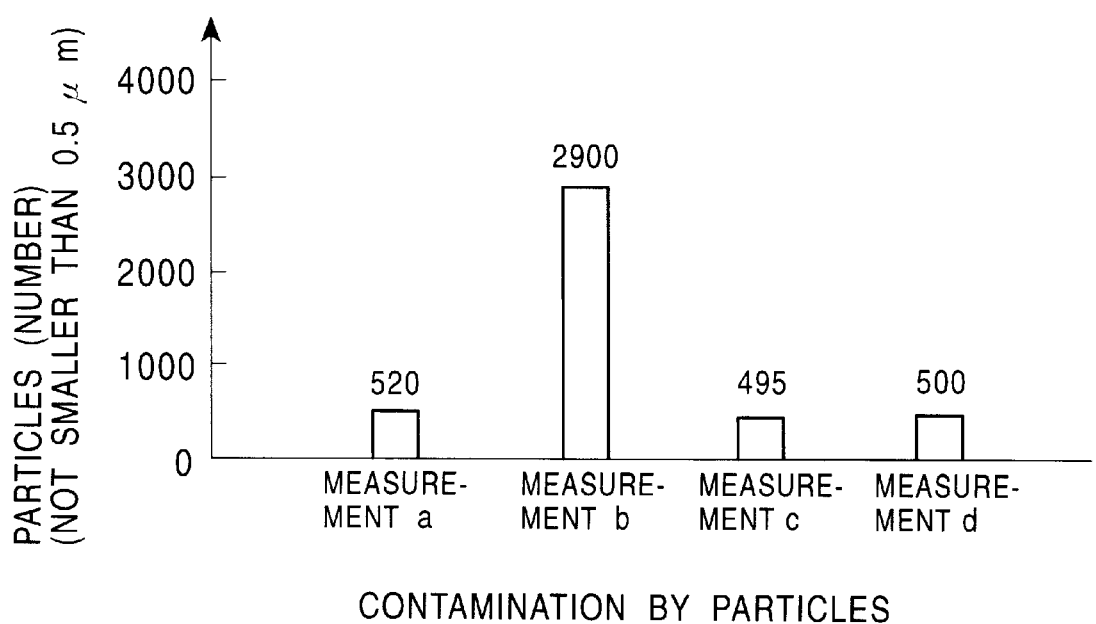
FIG. 13B represents contamination caused by particles.

The measured results are shown in FIGS. 13A and 13B as being indicated by "MEASUREMENT a". FIG. 13A represents the results measured for organic substances and FIG. 13B represents the results measured for particles.

For the sample b, the substrate for a liquid crystal display device was kept remain in the loading/unloading chamber 8a for 2 hours, and thereafter measured for both organic substances and particles. The measured results are shown in FIGS. 13A and 13B as being indicated by "MEASUREMENT b".

For the sample c, the substrate for a liquid crystal display device was kept remain in the loading/unloading chamber 8a for 2 hours. After that, the substrate was carried into the cleaning apparatus 13 via the robot chamber 5 and cleaned in the cleaning apparatus 13 in the same manner as for the sample a.

After the end of the cleaning, the substrate was taken out to the outside via the robot room 5 and the loading/unloading chamber 8d, followed by measuring cleanness of the substrate surface.

The measured results are shown in FIGS. 13A and 13B as being indicated by "MEASUREMENT c".

For the sample d, the substrate for a liquid crystal display device was kept remain in the loading/unloading chamber 8a for 2 hours. After that, the substrate was carried into the cleaning apparatus 13 via the robot chamber 5 and cleaned in the cleaning apparatus 13 in the same manner as for the sample a.

After the end of the cleaning, the substrate was carried into the dry treatment chamber 7c via the robot room 15, the standby room 9b and the transfer room 6, the chamber 7c being held under a vacuum of $10^{-3}$ Torr.

After being kept remain in the dry treatment chamber 7c for 1 hour, the substrate was taken out to the outside via the transfer room 6, the standby room 9b, the robot room 15, the passage room 14, the robot room 5 and the loading/unloading chamber 8d, followed by measuring cleanness of the substrate surface.

The measured results are shown in FIGS. 13A and 13B as being indicated by "MEASUREMENT d".

As is apparent from comparing the measured results indicated by "MEASUREMENT b" and "MEASUREMENT d", organic substances and particles were both much smaller for the sample c represented by "MEASUREMENT d".

According to the present invention, as stated above, various advantages can be achieved. Thus, it is possible to provide an apparatus for producing semiconductor and other devices, which can improve the quality of deposited films and increase the yield of produced devices in comparison with the conventional apparatus.

What is claimed is:

1. An apparatus for producing semiconductors and other device, comprising:
   (a) an atmospherically sealed first place in which there are provided a plurality of dry treatment chambers for conducting dry treatment on objects and a transfer room interconnecting said dry treatment chambers;
   (b) a second place in which there is provided a loading/unloading chamber for loading said objects for dry treatment in said dry treatment chambers and unloading said objects on which dry treatment has already been conducted;
   (c) a passage connecting said first and second places for conveying said objects between them in an atmospherically sealed manner; and
   (d) a third place in which there is provided a cleaning apparatus for cleaning said objects being conveyed through said passage, said cleaning apparatus including a gas generating device for generating an ozone gas and a hydrogen gas,
      a gas dissolving device for dissolving said ozone gas and said hydrogen gas respectively into pure water to produce ozonized water and hydrogenated water, and
      a cleaning device for spraying said ozonized water and said hydrogenated water onto said objects, wherein said third place has an atmospherically sealed area in which at least said cleaning device is disposed.

2. The apparatus for producing semiconductors and other devices according to claim 1, wherein said gas generating device includes an electrolytic cell made of an anode chamber and a cathode chamber, said anode chamber generating said ozone gas, said cathode chamber generating said hydrogen gas, said gas dissolving device including an ozone gas dissolving tower for dissolving said ozone gas in said pure water to produce said ozonized water, and a hydrogen gas dissolving tower for dissolving said hydrogen gas in said pure water to produce said hydrogenated water.

3. The apparatus for producing semiconductors and other devices according to claim 2, wherein said ozone gas dissolving tower is positioned close to said cleaning device.

4. The apparatus for producing semiconductors and other devices according to claim 1, wherein said cleaning device has two splay nozzles for splaying said ozonized water and said hydrogenated water, respectively.

5. The apparatus for producing semiconductors and other devices according to claim 1, wherein said cleaning device has a holder for rotatably holding said object.

6. A cleaning apparatus for cleaning objects comprising:

a gas generating device for generating an ozone gas and a hydrogen gas, said gas generating device including an electrolytic cell made of an anode chamber and a cathode chamber, said anode chamber generating said ozone gas, said cathode chamber generating said hydrogen gas;

a gas dissolving device for dissolving said ozone gas and said hydrogen gas respectively into pure water to produce ozonized water and hydrogenated water, said gas dissolving device including an ozone gas dissolving tower for dissolving said ozone gas in said pure water to produce said ozonized water, and a hydrogen gas dissolving tower for dissolving said hydrogen gas in said pure water to produce said hydrogenated water; and a cleaning device for spraying said ozonized water and said hydrogenated water onto said objects.

7. The cleaning apparatus according to claim 6, wherein said cleaning device has two splay nozzles for splaying said ozonized water and said hydrogenated water, respectively.

8. The cleaning apparatus according to claim 6, wherein said cleaning device has a holder for rotatably holding said object.

9. The cleaning apparatus according to claim 6, wherein said ozone gas dissolving tower is positioned adjacent to said cleaning device.

* * * * *

UNITED STATES PATENT AND TRADEMARK OFFICE
CERTIFICATE OF CORRECTION

PATENT NO.     : 6,035,871
DATED          : March 14, 2000
INVENTOR(S)    : Oh Eui-Yeol It is certified that error appears in the above-identified patent and that said Letters Patent is hereby corrected as shown below:

Column 10,
Line 33, change "device" to -- devices --.
Line 47, change "conveved" to -- conveyed --.

Column 11,
Line 9, change "splay nozzles for splaying" to -- spray nozzles for spraying --.

Column 12,
Line 12, change "splay nozzles for splaying" to -- spray nozzles for spraying --.

Signed and Sealed this

Tenth Day of December, 2002

JAMES E. ROGAN
*Director of the United States Patent and Trademark Office*